(12) United States Patent
D'Souza et al.

(10) Patent No.: US 11,588,399 B2
(45) Date of Patent: Feb. 21, 2023

(54) POWER SUPPLY CATERING TO PEAK CURRENT DEMANDS OF A LOAD

(71) Applicant: Aura Semiconductor Pvt. Ltd, Bangalore (IN)

(72) Inventors: Arnold J D'Souza, Bangalore (IN); Shyam Somayajula, Bangalore (IN)

(73) Assignee: Ningbo Aura Semiconductor Co., Limited, Zhejiang (CN)

( * ) Notice: Subject to any disclaimer, the term of this patent is extended or adjusted under 35 U.S.C. 154(b) by 173 days.

(21) Appl. No.: 17/248,804

(22) Filed: Feb. 9, 2021

(65) Prior Publication Data

US 2021/0265911 A1    Aug. 26, 2021

(30) Foreign Application Priority Data

Feb. 26, 2020    (IN) .............................. 202041008131

(51) Int. Cl.
| | |
|---|---|
| *H02M 3/156* | (2006.01) |
| *H02M 3/07* | (2006.01) |
| *H03F 3/217* | (2006.01) |
| *H03F 3/185* | (2006.01) |

(52) U.S. Cl.
CPC ............. *H02M 3/156* (2013.01); *H02M 3/07* (2013.01); *H03F 3/185* (2013.01); *H03F 3/2171* (2013.01); *H03F 2200/03* (2013.01)

(58) Field of Classification Search
None
See application file for complete search history.

(56) References Cited

U.S. PATENT DOCUMENTS

| | | | |
|---|---|---|---|
| 6,836,097 B2 | 12/2004 | Turner et al. | |
| 7,239,206 B2 | 7/2007 | D'Amore | |
| 8,174,209 B2 | 5/2012 | Bayer et al. | |
| 8,593,113 B2 | 11/2013 | Baker et al. | |
| 9,071,055 B2 | 6/2015 | Ferrario | |
| 9,231,543 B2 | 1/2016 | Hogan et al. | |
| 9,319,495 B2 * | 4/2016 | D'Souza | H03F 1/0227 |
| 9,444,340 B2 * | 9/2016 | Tournatory | H02M 3/158 |
| 10,069,307 B2 * | 9/2018 | Takenaka | H02M 7/44 |
| 10,283,989 B1 | 5/2019 | Hogan et al. | |

(Continued)

OTHER PUBLICATIONS

"Pierre Mars", Pump Up the Volume! Supercapacitors Enhance Audio and Power in Cell Phones, https://www.edn.com/pump-up-the-volume-supercapacitors-enhance-audio-and-power-in-cell-phones/, Oct. 8, 2007, 04 pages.

(Continued)

*Primary Examiner* — Jeffrey A Gblende
(74) *Attorney, Agent, or Firm* — IPHorizons PLLC; Narendra Reddy Thappeta

(57) ABSTRACT

A power supply includes a first DC-DC converter coupled to receive power from a first power source, a second DC-DC converter coupled to receive power from a second power source, and a control block. The first DC-DC converter is operable to generate a regulated power supply voltage on an output node of the power supply. The first power source has a maximum output current limit. The second DC-DC converter is also operable to generate a regulated power supply voltage on the output node. The control block is designed to generate the regulated power supply voltage based on both of the first DC-DC converter and the second DC-DC converter.

19 Claims, 6 Drawing Sheets

(56) References Cited

U.S. PATENT DOCUMENTS

2017/0083070 A1* 3/2017 Drogi .................... H03F 1/0227
2017/0346298 A1* 11/2017 Chuang .................... G05F 5/00
2020/0042026 A1* 2/2020 Wang ...................... G05F 1/575

OTHER PUBLICATIONS

CAP-XX Announces BriteSound Power Architecture to Pump up the Volume in Music Phones, https://www.businesswire.com/news/home/20070612005902/en/CAP-XX-Announces-BriteSound-Power-Architecture-Pump-Volume, Jun. 12, 2007, 03 pages.

"T.A. Smith, et al", Using supercapacitors to improve battery performance, 2002 IEEE 33rd Annual IEEE Power Electronics Specialists Conference. Proceedings (Cat. No.02CH37289), Date of Conference: Jun. 23-27, 2002, pp. 124-128, IEEE.

"Duy-Hung Dam & Hong-Hee Lee", Battery-inductor-supercapacitor hybrid energy storage system for DC microgrids, Journal of Power Electronics, Dec. 10, 2019, 11 pages.

"Sanchit Gaikwad, et al", Batteryless Mobile using Supercapacitor with Wireless Charging, International Journal for Research in Applied Science & Engineering Technology (IJRASET), Mar. 2017, pp. 810-814, vol. 5 Issue III.

* cited by examiner

POWER SUPPLY CATERING TO PEAK CURRENT DEMANDS OF A LOAD

PRIORITY CLAIM

The instant patent application is related to and claims priority from the co-pending provisional India patent application entitled, "Supercap Based Boosted Class D Amplifier", Serial No.: 202041008131, Filed: Feb. 26, 2020, which is incorporated in its entirety herewith to the extent not inconsistent with the description herein.

BACKGROUND

Technical Field

Embodiments of the present disclosure relate generally to power supplies, and more specifically to a power supply catering to peak current demands of a load.

Related Art

Power supplies are used to provide regulated power for operation of electronic and/or electrical circuits and/or systems. The electronic and/or electrical circuits and/or systems represent a 'load' to the power supply, and draw a current (load current) from the power supply. Power supplies are designed to provide a desired value of voltage to the load irrespective of the current drawn by the load.

However, an upper limit for load current may exist depending, as an example, upon the source of power that is used by the power supply. For example, a battery (or electrochemical cell) may be able to provide only a certain maximum current. As a result, if the peak load current demanded is greater than the maximum current the battery can provide, the power supply may not be able to provide the demanded peak load current to the load and/or maintain the desired voltage provided to the load. At least in such environments, there exists a need to provide a power supply that can cater to the peak current demands of the load.

BRIEF DESCRIPTION OF THE VIEWS OF DRAWINGS

Example embodiments of the present disclosure will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

A power supply implemented according to an aspect of the present disclosure includes a first DC-DC converter coupled to receive power from a first power source, a second DC-DC converter coupled to receive power from a second power source, and a control block. The first DC-DC converter is operable to generate a regulated power supply voltage on an output node of the power supply. The first power source has a maximum output current limit. The second DC-DC converter is also operable to generate a regulated power supply voltage on the output node. The control block is designed to generate the regulated power supply voltage based on both of the first DC-DC converter and the second DC-DC converter.

In an embodiment, the control block is designed to operate only the first DC-DC converter to provide the regulated power supply voltage on the output node when a first peak current demand of one or more loads coupled to the output node is less than the maximum output current limit of the first power source. The control block designed to operate both of the first DC-DC converter and the second DC-DC converter to together provide the regulated power supply voltage on the output node when a second peak current demand of the one more loads exceeds the maximum output current limit.

According to an aspect of the present disclosure, when the second peak current demand of the load exceeds the maximum output current limit, the control block is designed to operate the first DC-DC converter as a current source to provide a first current, and the second DC-DC converter as a voltage source to provide a second current as well as to regulate the supply voltage. In an embodiment of the present disclosure, the magnitude of the first current equals the maximum output current limit of the first power source, and the magnitude of the second current equals the difference of the second peak current demand and the first current.

Several aspects of the present disclosure are described below with reference to examples for illustration. However, one skilled in the relevant art will recognize that the disclosure can be practiced without one or more of the specific details or with other methods, components, materials and so forth. In other instances, well-known structures, materials, or operations are not shown in detail to avoid obscuring the features of the disclosure. Furthermore, the features/aspects described can be practiced in various combinations, though only some of the combinations are described herein for conciseness.

2. Example Environment

Figure 1:
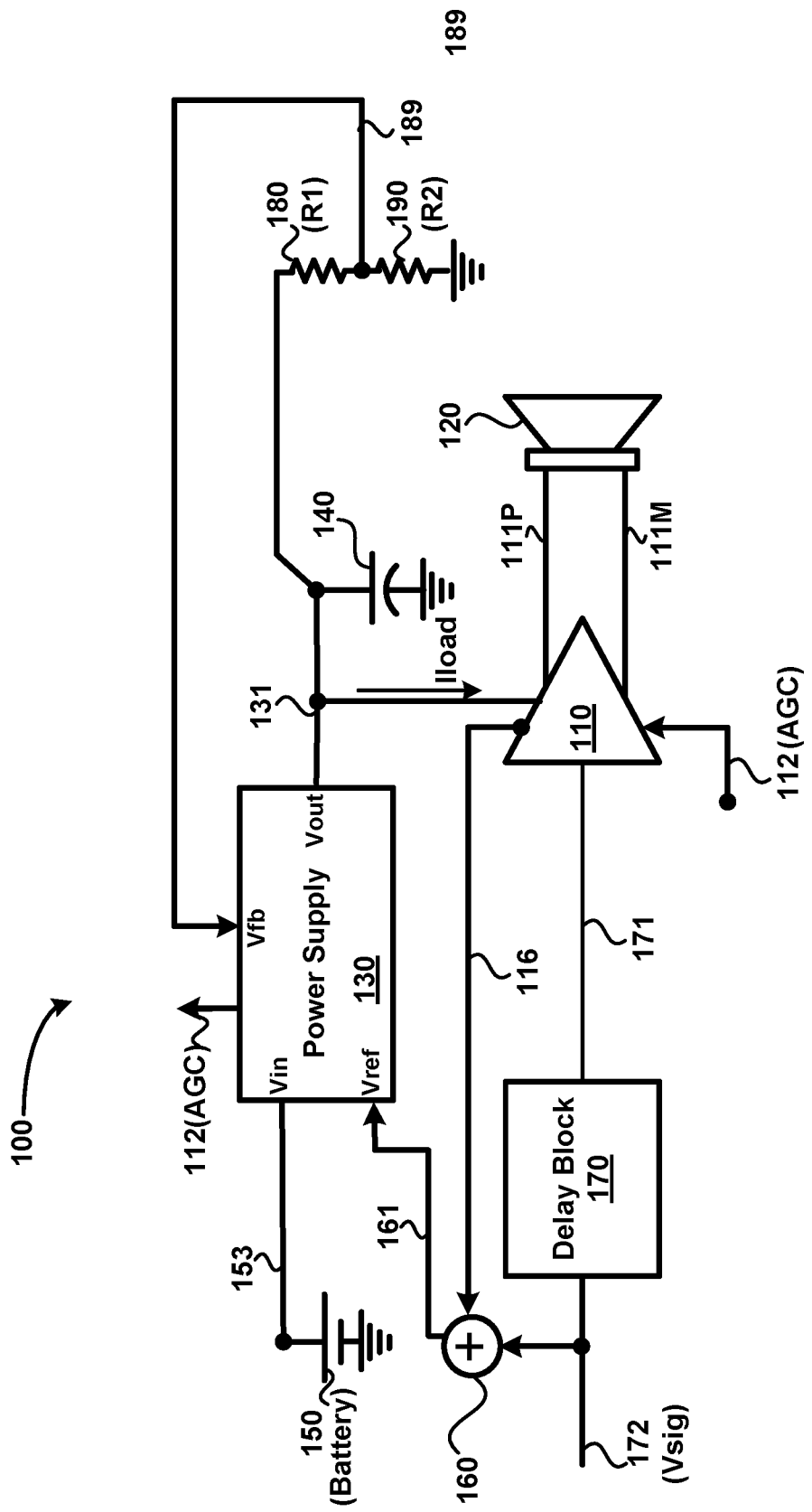
FIG. 1 is a block diagram of an example device in which several aspects of the present disclosure can be implemented.

FIG. 1 is a block diagram of an example device in which several aspects of the present disclosure can be implemented. The example of FIG. 1 illustrates the details of a class-L amplifier 100, which is described in further detail in U.S. Pat. No. 9,319,495, entitled 'Power Amplifier Providing High Efficiency', which is incorporated in its entirety herewith. A class L amplifier is a power amplifier that employs power supply modulation to maintain the magnitude of the power supply voltage (provided to the power amplification stage within the amplifier) to be at all times greater than instantaneous magnitudes of the power-amplified output signal by a constant amount. In the interest of conciseness, only relevant details as needed for understanding the present disclosure are provided herein, and the reader is directed to the US patent noted above for further details. It is noted however, that a power supply implemented according to aspects of the present disclosure can be employed in other environments, and to power other devices/systems (or loads in general, such as, for example, a class-D amplifier) as well. Thus, for example, amplifier block 110 can be a class-D amplifier also.

Class-L amplifier 100 is shown containing amplifier block 110, speaker 120, power supply 130, capacitor 140, battery 150, summation block 160, delay block 170, and resistors 180 and 190.

Vsig on path 172 represents a speech and/or audio signal to be amplified by amplifier block 110. Delay block 170 delays Vsig, and provides a delayed Vsig to amplifier block 110 on path 171. The delay provided by delay block 170 is designed to provide sufficient time for power supply 130 to respond to changes in Vsig, and therefore the signal 111P/111M fed to speaker 120, so as to always maintain the magnitude of voltage 131 greater than the instantaneous magnitudes of signal 111P/111M by a constant amount. Delay block 170 is powered by Vout (131) although the connection is not shown in FIG. 1.

Amplifier block 110 may contain one or more amplification stages within it (for example, a pre-amplifier stage followed by a power amplifier stage), and receives power for operation from power supply 130 via path 131. Alternatively, only the power amplification stage within amplifier block 110 may be powered by power supply output 131, with the pre-amplifier stage being powered by a separate power supply. Amplifier block 110 receives the delayed signal on path 171, amplifies the signal, and provides the amplified signal to speaker 120 across differential terminals 111P and 111M. Although only one amplifier block and speaker are shown in FIG. 1, Class-L amplifier 100 may contain a pair each of such an amplifier and speaker, with power supply 130 powering both such amplifiers.

Summation block 160 receives Vsig and a signal 116 representative of the magnitude of output voltage 111P/111M of amplifier block 110. In an embodiment, signal 116 is the greater of the absolute values (magnitudes) of the instantaneous values on terminals 111P and 111M. Summation block 160 adds the instantaneous magnitudes of Vsig and signal 116, and forwards the sum on path 161. Summation block 160 is powered by Vout (131) although the connection is not shown in FIG. 1. Although summation block 160 and delay block 170 are shown implemented external to power supply 130, these blocks can also be implemented within power supply 130 in the form of digital and/or analog circuitry/blocks.

Power supply 130 receives power from battery 150 on path 153 on its Vin terminal, reference voltage 161 on its Vref terminal, and a feedback voltage on path 189 on its Vfb terminal. Resistors R1 (180) and R2 (190) represent a voltage divider, and generate a voltage on path 189 that is representative of the output voltage 131. The resistances of R1 and R2 may be chosen based on the internal implementation details of power supply 130, as is well known in the relevant arts.

Power supply 130 generates output voltage 131 based on the voltages at Vref and Vfb. In the example of FIG. 1, power supply 130 is implemented as a DC-DC boost converter, and the magnitude of voltage 131 is greater than the battery voltage of battery 150. However, it is to be noted that power supply 130 can be implemented as a buck converter or a buck-boost converter also, in other embodiments, as would be apparent to one skilled in the relevant arts on reading the disclosure herein. Further, the feedback control mechanism implemented within power supply 130 can, in general, be in the form of voltage-mode, current-mode or hysteretic control. In the example of FIG. 1, hysteretic control is employed, and is described in sections below. The use of automatic gain control (AGC) signal 112 is described in sections below.

Load current (Iload) drawn from power supply 130 is the sum of all currents drawn by the various loads connected to power supply 130, and therefore equal to the current flowing out of output node Vout of the power supply. In FIG. 1, the load current Iload is the sum of current Iamp drawn by amplifier block 110, current Id flowing into the voltage divider, and currents drawn by blocks 160 and 170. The magnitudes of Id and the currents drawn by blocks 160 and 170 are typically negligible compared to Iamp. Therefore, Iload in FIG. 1 would substantially equal Iamp drawn by amplifier 110 and speaker 120.

Battery 150 is typically associated with a maximum output current limit. As an example, battery 150 may have a battery voltage of 3.6 volts (V) and a maximum output current limit of 5 amperes (A). Therefore, when the load current (Iload) demanded by the load(s) on power supply output node 131 is greater than the maximum output current limit, battery 150 is unable to supply the excess current, which may lead to clipping or distortion of the output signal across 111P/111M. Alternatively, even if battery 150 is able to provide such excess current (at least for short durations), such operation may adversely affect battery life, and therefore not desirable. In other embodiments, other types of power sources such as a fuel cell may be used in place of battery 150. Such power sources may also have a maximum output current limit.

Figure 2:
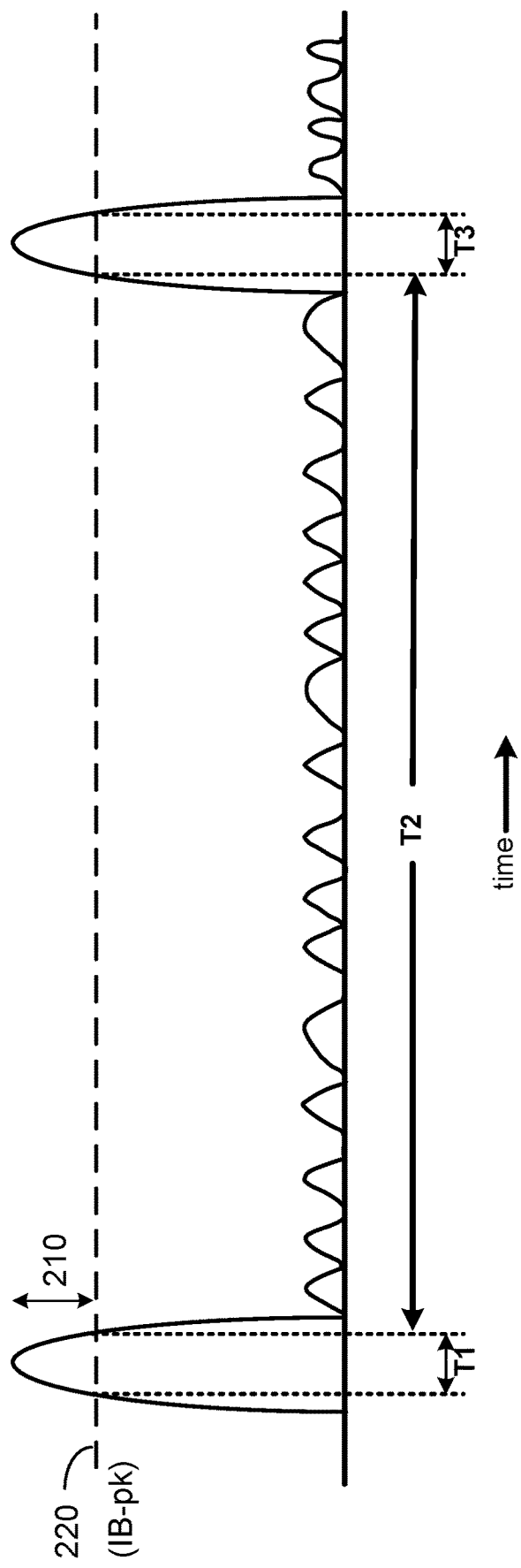
FIG. 2 is a diagram illustrating an example load current demand pattern versus time on a power.

FIG. 2 illustrates an example load current demand versus time on power supply 130. In interval T2, the load current demand is much smaller than the peaks occurring in intervals T1 and T3. In intervals T1 and T3, the load current demand exceeds the maximum output current limit 220 (IB-pk, for example 5A) of battery 150. The excess current 210 would need to be supplied by a source other than battery 150 if signal clipping or distortion is to be avoided and/or if the corresponding excess power is still desired to be delivered to the load (for example, in accordance with features described below).

An example scenario is when the blocks of FIG. 1 are inside a mobile phone (e.g., a smartphone). Next generation speakerphones may demand 10 W or higher power. Although the speakers can handle these power levels, the battery used in the mobile phone may have limited peak current capability. Since there are many subsystems in a smartphone that may be operating during music playback, the speaker amplifier has a peak current budget that it can draw from the battery. As an example, the speaker amplifier may have a peak current budget of approximately 5 A. A boosted class-D power amplifier may draw approximately 4.95 A peak current from the battery to deliver 7 Watts (W) into an 8 ohm (Ω) speaker. To deliver larger power, such as the 10 W noted above, the power amplifier will need to draw a peak current of about 7 A. The additional current may therefore have to come from another source.

A power supply implemented according to aspects of the present disclosure, additionally employs an additional charge storage device, such as a capacitor or a super-capacitor (ultra-capacitor or high-capacity capacitor), as well as additional circuitry to enable the power supply to provide load current demands in excess of that which can be provided by the battery (or in general, the primary power source), as described next with examples.

3. Power Supply

Figure 3:
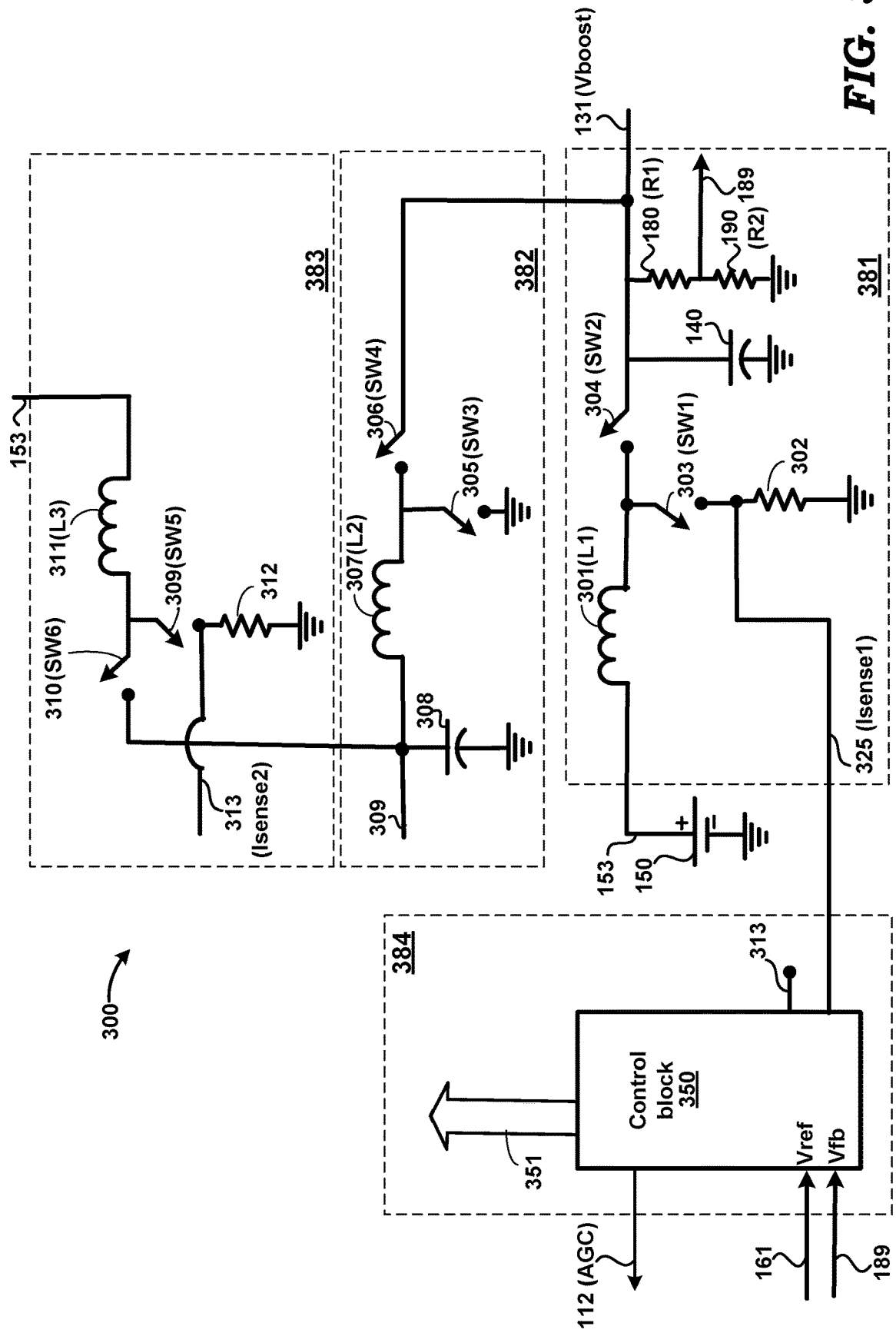
FIG. 3 is a diagram of a power supply in an embodiment of the present disclosure.

FIG. 3 is a diagram of a power supply 300 in an embodiment of the present disclosure. Power supply 300 is shown containing DC-DC boost converters 381, 382 and 383, and control block 350. Battery 150 is shown external to power supply 300. Capacitor 140 and voltage divider formed by resistors 180 (R1) and 190 (R2) are shown internal to power supply 300, but can be implemented to be external to power supply 300 also. When power supply 300 is implemented in the form of an integrated circuit (IC), load capacitor 140 may be implemented off-chip. Summation block 160 and delay block 170 of FIG. 1 are shown not shown in FIG. 3 in the interest of conciseness and clarity, but can be implemented within power supply 300 in the form of digital and/or analog circuitry/blocks in a known way.

Although shown implemented to contain boost converters, power supply 300 may instead be implemented to contain buck converters or buck-boost converters in place of boost converters 381, 382 and 383 (based on the output voltage 131 requirements), with control block 350 implemented correspondingly. Further, the implementation details of power supply 300 are provided merely by way of illustration, and alternative implementation or modifications would be well known to one skilled in the relevant arts. Control block 350 controls the operations of boost converters 381, 382 and 383, as described below. Power supply 300 can be used in place of power supply 130 of FIG. 1.

Boost converter 381 is shown containing inductor 301 (L1), switches 303 (SW1) and 304 (SW2), resistor 302, capacitor 140 and voltage divider formed by resistors 180 (R1) and 190 (R2). Switches SW1 and SW2 may, for example, be implemented as transistors such as MOS (metal oxide semiconductor) transistors, BJT (bipolar junction transistor), etc. Control block 350 controls the operation of switches SW1 and SW2 to cause boost converter 381 to either generate a regulated voltage on output 131 or as a current source as described below. The voltage at node 325 (Isense1) is available to control block 350 to determine the magnitude of the load current Iload drawn from battery 150 via boost converter 381. It is noted here that alternative methods, well known in the relevant arts, can instead be employed for sensing the inductor current (currents through L1 and L3). The voltage 189 at the junctions of resistors R1 and R2 is provided as an input to control block 350 on terminal marked Vfb.

Boost converter 382 is shown containing capacitor 308, inductor 307 (L2), and switches 305 (SW3) and 306 (SW4). Switches SW3 and SW4 may, for example, be implemented as transistors such as MOS transistors, BJT etc. Control block 350 controls the operation of switches SW3 and SW4 to cause boost converter 382 to generate, when operational, a regulated voltage on output 131 as described below.

Boost converter 383 receives power from battery 150 (node 153) and is shown containing inductor 311 (L3), switches 309 (SW5) and 310 (SW6), and resistor 312. Switches SW5 and SW6 may, for example, be implemented as transistors such as MOS transistors, BJT, etc. Control block 350 controls the operation of switches SW9 and SW10 to cause boost converter 383, when operational, to charge capacitor 308 (operative as example second power source) of boost converter 382 as described below. The voltage at node 313 (Isense2) is available to control block 350 to determine the magnitude of the charging current drawn from battery 150 via boost converter 383.

Boost converter 381 operates as the primary DC-DC converter in power supply 300. Boost converter 381 receives power directly from battery 150 and is always operational (when power supply 300 is ON). In intervals in which load current Iload is required to be only less than or equal to the maximum output current limit IB-pk (220 in FIG. 2) of battery 150, boost converter 381 regulates voltage 131 to maintain voltage 131 at the desired level, and thus generates a regulated voltage output on node 131. In such intervals, all of the load current is sourced directly from battery 150. With reference to FIG. 2, T2 represents such an interval.

However, in intervals in which load current Iload is required to be greater than the maximum output current limit IB-pk of battery 150, boost converter 381 does not regulate the voltage on node 131 and is instead operated as a current source to provide a substantially constant current into node 131. In an embodiment, the constant current equals the maximum output current limit IB-pk of battery 150. However, in alternative embodiments, the magnitude of the constant current can be less than IB-pk. With reference to FIG. 2, each of T1 and T3 represents an interval in which load current Iload is greater than IB-pk. In such intervals, boost converter 382 is additionally operational (as a voltage source), and generates the desired regulated voltage (Vboost) on node 131 and supplies the excess current (i.e., the load current Iload in excess of the constant current provided by boost converter 381). Thus, with reference to FIG. 2, excess current indicated by marker 210 is supplied by boost converter 382. Boost converter 382 receives power from capacitor 308. The voltage on capacitor 308 is monitored by control block 350. When a lower threshold voltage (Vlower) is reached (due to discharge of capacitor 308 when boost converter 382 is operational), further discharge of capacitor 308 is prevented by stopping the operation of boost converter 382 even if the required Iload were to be greater than IB-pk, and control block 350 limits the gain of amplifier block 110 via Automatic Gain Control (AGC) signal 112 so as not to clip or distort output signal 111P/111M. Similarly, control block 350 initiates operation of boost converter 382 only when the voltage on capacitor 308 is greater than or equal to the lower threshold voltage Vlower.

Boost converter 383 is operational only in intervals in which load current Iload is required to be only less than or equal to the maximum output current limit IB-pk, and charges capacitor 308 in such intervals. Boost converter 383 receives power directly from battery 150 to charge capacitor 308. In an embodiment, boost converter 383 is designed to charge capacitor 308 to a voltage equal to 6V. In general, a larger voltage is desirable since capacitor 140 can then provide current for a longer time before discharging to a voltage below a desired lower threshold (Vlower). The available capacitor values generally reduce as the operating voltage increases. For example, a 100 uF/6V capacitor at a desired size may be available, but for the same size the maximum capacitance available for a 10V rating may be smaller.

In an embodiment of the present disclosure, battery 150 is a lithium-ion battery with a battery voltage of 3.6V, capacitor 308 is a 220 micro-farad (uF) molded tantalum capacitor, and power supply 300 is designed to provide a maximum power output of 10 W. For 10 W power into 8 Ohms (impedance of speaker 120), the peak voltage on Vboost (131) is 12.64V. However, amplifier 110 might, in practice, need some headroom to be able to operate properly. Hence, in practice the peak voltage on Vboost may need to be approximately 10% to 20% greater than 12.64V.

The maximum output current limit of battery 150 is 5 A. Thus, the current limit of boost converters 381 and 383 together is set to 5 A, so that the peak current drawn from battery 150 does not ever exceed 5 A.

Control block 350 determines whether load current Iload is required to be only less than or equal to the maximum output current limit IB-pk, or greater than IB-pk based on either look-ahead (feed-forward) or feedback techniques or both. Based on such determination, control block 350 controls the operation of boost converters 381, 382 and 383 to cause them to operate as noted above.

The implementation details of control block 350 in an embodiment of the present disclosure are described next.

4. Control Block

Figure 4:
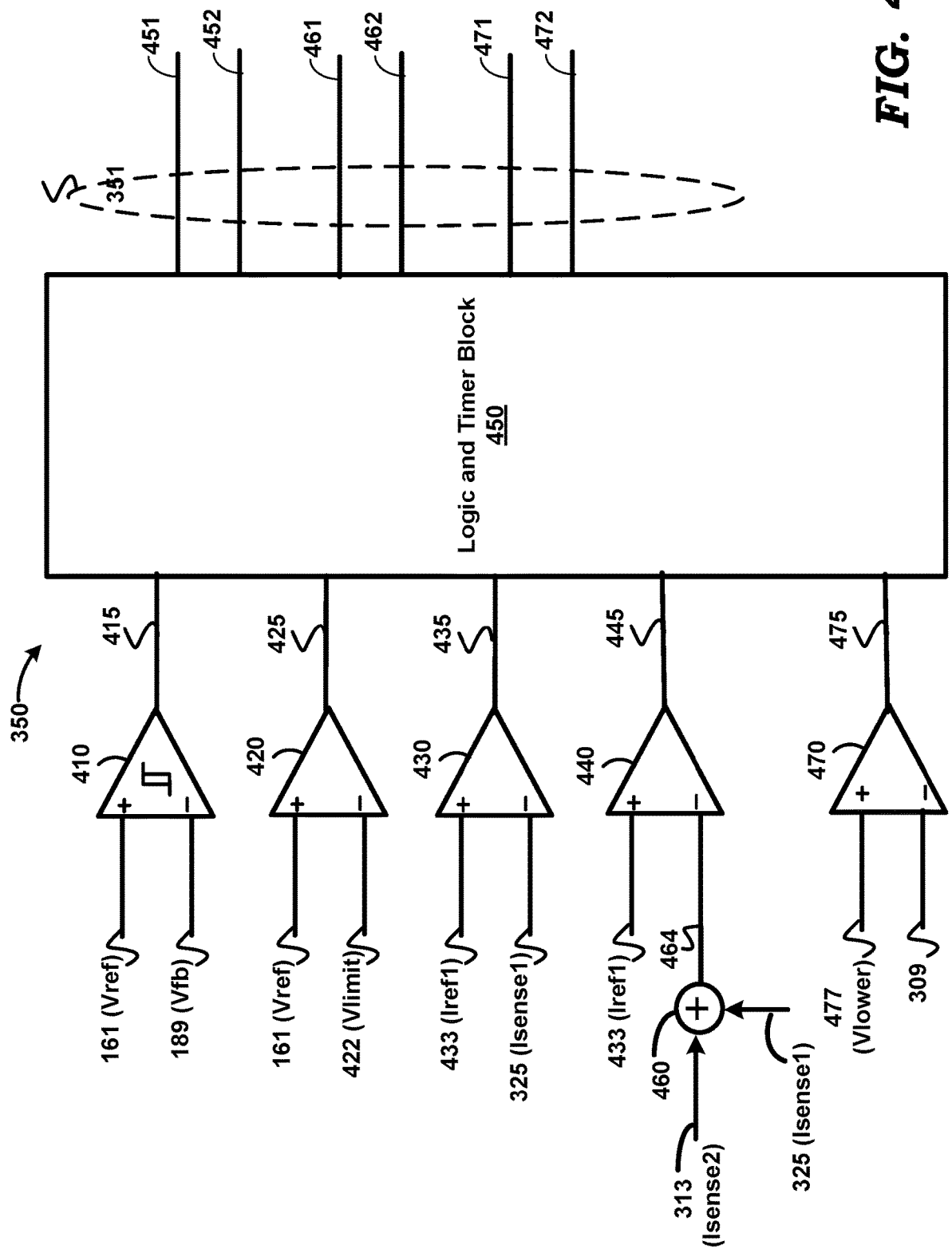
FIG. 4 is a block diagram of a control block of a power supply in an embodiment of the present disclosure.

FIG. 4 is a block diagram of control block 350 in an embodiment of the present disclosure. Again, the specific details are provided merely as an example, and control block 350 can also be implemented differently as would be apparent to one skilled in the relevant arts upon reading the disclosure herein. Control block 350 is shown containing comparators 410, 420, 430 and 440, logic and timer block 450 and summation block 460.

Comparator 410 receives as inputs signals 161 (Vref) and 189 (Vfb), and generates a binary signal on path 415. Comparator 410 is implemented to have hysteresis, which may be designed to be equivalent to a few millivolts. Signal 415 is a logic high when Vref exceeds Vfb by the hysteresis value (millivolts noted above), and a logic low when Vref is less than Vfb by the hysteresis value. A logic high value of signal 415 indicates (to logic and timer block 450) that output voltage 131 of power supply 300 is less than the desired value, and therefore that either of boost converters 381 and 382 (depending on which one of the two is currently regulating output 131) should be operated to boost output voltage 131 to the desired value. The comparison of Vfb with Vref enables power supply 300 to always maintain output voltage 131 to be greater than the higher one of the absolute values of instantaneous magnitudes of signals 111P AND 111M, so as ensure that distortion/clipping of the output signal 111P/111M is avoided, while still providing class-L power supply modulation. However, it may be appreciated that in other embodiments, output voltage 131 and Vref can each be fixed values when class-L modulation is not required. In such embodiments, Vref may be generated by a voltage reference implemented internal to power supply 300.

Comparator 420 receives as inputs signals 161 (Vref) and a reference voltage 422 (Vlimit), and generates a binary signal on path 425. Signal 425 is a logic high when Vref exceeds Vlimit, and a logic low otherwise. Vlimit may be generated by a voltage reference (not shown) within control block 350. Vlimit represents the upper limit of Vref corresponding to a condition that the required load current Iload would exceed the maximum output current limit IB-pk of battery 150. This is because the load presented to amplifier-block 110 is predominantly resistive, and therefore Vsig 172 would be directly indicative of the load current Iload. A logic high value of signal 425 indicates (to logic and timer block 450) that Iload is not required to be greater than or equal to IB-pk, while a logic low value of signal 425 indicates that Iload is required to be greater than IB-pk.

Comparator 430 receives as inputs signals 433 (Iref1) and signal 325 (Isense1), and generates a binary signal on path 435. Signal 435 is a logic high when Iref1 exceeds Isense1, and a logic low otherwise. Iref1 may be generated by a voltage reference (not shown) implemented within control block 350. Isense1 represents the voltage across resistor 302 (FIG. 3) and is indicative of the current supplied by boost converter 381, and therefore of Iload. Signal 435 is used by logic and timer block 450 when boost converter 381 is employed as a current source and also to limit the current drawn from battery 150, as noted below. The magnitude of Iref1 may be set to have a value corresponding to IB-pk, and represents the maximum current that may be allowed to be drawn from battery 150 (i.e., maximum output current limit of battery 150).

Summation block 460 may represent a voltage summing circuit, and provides on path 464 the sum of voltages Isense1 and Isense2. Comparator 440 receives as inputs signals 433 (Iref1) and signal 464, and generates a binary signal on path 445. Signal 445 is a logic high when Iref1 exceeds the sum of Isense1 and Isense2, and a logic low otherwise. Isense2 represents the voltage across resistor 312 (FIG. 3) and is indicative of the current supplied by boost converter 383 to charge capacitor 308 of boost converter 382. Signal 445 is used by logic and timer block 450 to limit the total current drawn from battery 150 at any instant to less than or equal to IB-pk.

Comparator 470 receives as inputs signals 477 (Vlower) and signal 309, and generates a binary signal on path 475. Signal 475 is a logic high when Vlower exceeds the voltage on path 309 (voltage across capacitor 308), and a logic low otherwise. Vlower represents the lower limit of the voltage across capacitor 309 as noted above, and may be generated by a voltage reference (not shown) in power supply 300. Signal 475 is used by logic and timer block 450 to prevent capacitor 308 from being discharged to a voltage less than Vlower.

Although only comparator 410 is indicated in FIG. 4 as having hysteresis, each of the other comparators, namely 420, 430, 440 and 470 may also be implemented to have hysteresis of desired amounts.

Logic and timer block 450 receives signals 415, 425, 435, 445 and 475, and generates switch control signals 451, 452, 461, 462, 471 and 472 that control the states (open or closed) of switches SW1, SW2, SW3, SW4, SW5 and SW6 respectively to enable operation of blocks 381, 382 and 383 as boost converters as noted above. Logic and timer block 450 may be implemented to contain one or more timers in additional digital logic blocks (e.g., AND gates, OR gates, etc.). The logic implemented within logic and timer block 450 to cause the various states of operation of power supply 300 as noted above is described next.

A) Required load current Iload is less than or equal to IB-pk (as indicated by signal 425): Logic and timer block 450 operates boost converter 381 to generate a regulated voltage at node 131, and boost converter 383 to charge capacitor 308. The magnitude of the regulated voltage is designed to be always greater than Vref by a fixed amount as noted above. Logic and timer block 450 disables operation of boost converter 382 by maintaining switches SW3 and SW4 in open condition via respective switch control signals 461 and 462.

When Vref is greater than Vfb by the hysteresis amount (noted above), signal 415 is at logic high, and logic and timer block 450 operates SW1 and SW2 to boost the voltage at node 131 to the required value until Vref becomes less than Vfb by the hysteresis amount. Accordingly, logic and timer block 450 may close SW1 for a predetermined amount of time (based on timer(s) implemented within logic and timer block 450, but not shown) during a charging phase. Logic and timer block 450 may then close SW2 and open SW1 during a discharge phase. The ON (closed) durations of SW1 and SW2 may be determined by the specific magnitude of voltage 131, which is designed to be always greater than Vref by a fixed amount as noted above.

When Vref is less than Vfb by the hysteresis amount (due to Iload discharging capacitor 140), signal 415 is at logic low, and logic and timer block 450 maintains both of switches SW1 and SW2 in open condition via respective switch control signals 451 and 452. Load current is drawn from capacitor 140.

Logic and timer block 450 operates SW5 and SW6 to cause operation of boost converter 383 to generate a voltage (greater than battery voltage) to charge capacitor 308, Thus, logic and timer block 450 may close SW5 for a predetermined amount of time (based on timer(s) implemented within logic and timer block 450, but not shown) during a charging phase. Logic and timer block 450 may then close SW6 and open SW5 during a discharge phase. Logic and timer block 450 may control the operation of boost converter 383 using feedback signal(s) and reference signal similar to Vfb and Vref described above with respect to boost converter 381, but with corresponding magnitudes, and are not shown or described herein in the interest of conciseness.

Since each of boost converters 381 and 383 receives power directly from battery 150, logic and timer block 450 also limits the maximum current drawn from battery 150 at any time during operation of boost converters 381 and 383, to a value less than or equal to the maximum output current limit IB-p of battery 150. Thus, if signal 445 is a logic low (indicating that the total current drawn from battery 150 is greater than IB-pk), logic and timer block 450 limits the charging phase duration (ON time of switches SW1 and SW5) of respective boost converters 381 and 383 so as to limit the sum of inductor currents in L1 and L3 to a value less than IB-pk. In an alternative embodiment, logic and timer block 450 reduces the current drawn by boost converter 383 (for example, to allow boost converter 381 to supply more current, if needed, to node Vboost 131), while maintaining the sum of currents drawn by boost converter 381 and 383 to a value less than IB-pk.

B) Required load current Iload is greater than IB-pk (as indicated by signal 425): Logic and timer block 450 operates boost converter 382 to generate a regulated voltage at node 131 (provided that signal 475 is at logic high), and boost converter 381 to supply a constant current. The magnitude of the regulated voltage is designed to be always greater than Vref by a fixed amount, similar to the state when boost converter 381 regulates voltage 131. Logic and timer block 450 disables operation of boost converter 383 by maintaining switches SW5 and SW6 in open condition via respective switch control signals 471 and 472.

When Vref is greater than Vfb by the hysteresis amount (noted above), signal 415 is at logic high, and logic and timer block 450 operates SW3 and SW4 to boost the voltage at node 131 to the required value until Vref becomes less than Vfb by the hysteresis amount. Accordingly, logic and timer block 450 may close SW3 for a predetermined amount of time (based on timer(s) implemented within logic and timer block 450, but not shown) during a charging phase. Logic and timer block 450 may then close SW4 and open SW3 during a discharge phase. The ON (closed) durations of SW3 and SW4 may be determined by the specific magnitude of voltage 131, which needs to be always greater than Vref by a fixed amount as noted above.

During the operation of boost converter 382, if voltage across capacitor 308 were to fall below Vlower (as indicated by signal 475), logic and timer block 450 logic and timer block 450 disables boost converter 382 by maintaining switches SW3 and SW4 in open condition via respective switch control signals 461 and 462 thereby ensuring that voltage across capacitor 308 never falls below Vlower. Logic and timer block 450 resumes operation of boost converter 381 (back from current source mode) to regulate the voltage on output node 131. In addition, logic and timer block 450 generates a corresponding signal on path 112 (AGC) to limit the gain of amplifiers in amplifier block 110. As an example, signal 112 may limit the voltage gain of a pre-amplifier stage within amplifier block 110. In addition, logic and timer block 450 also causes boost converter 381 to reduce the voltage 131 correspondingly.

In an alternative embodiment, the value of Vlower is set (with some margin) such that the combination of boost converter 381 and boost converter 382 would still be able to supply the load current Iload till the AGC mechanism has reduced the gain of amplifiers in amplifier block 110, and logic and timer block 450 also has caused boost converter 381 to reduce the voltage 131 correspondingly. Only then does logic and timer block disable boost converter 382 and resume operation of boost converter 381 to regulate the voltage on Vboost 131.

When Vref is less than Vfb by the hysteresis amount (due to Iload discharging capacitor 140), signal 415 is at logic low, and logic and timer block 450 maintains both of switches SW3 and SW4 in open condition via respective switch control signals 451 and 452. Load current is drawn from capacitor 140.

Logic and timer block 450 operates boost converter 381 as a current source to provide a substantially constant current into node 131. In an embodiment, the value of the constant current equals the maximum output current limit IB-pk of battery 150. However, in other embodiments, the value of the constant current may be set to be less than IB-pk. In FIG. 4, Tref is a voltage corresponding to the maximum output current limit. Thus, when signal 435 is at logic high, logic and timer block 450 maintains both of switches 451 and 452 open via respective switch control signals SW1 and SW2. When signal 435 is at logic low, logic and timer block 450 may close SW1 for a predetermined amount of time (based on timer(s) implemented within logic and timer block 450, but not shown) during a charging phase. Logic and timer block 450 may then close SW2 and open SW1 during a discharge phase. The durations of ON times of SW1 and SW2 may be determined by the magnitude of constant current that is desired, and equals 5 A in an embodiment. Signals Vref and Vfb are not used to control the operation of boost converter 381 when operated in current source mode.

It may be appreciated from the foregoing description that boost converters 382 and 383 are orthogonal in operation. i.e., when one is being operated the other is non-operational. Therefore, they can be combined with additional switches to reduce the inductor count from two to one, as illustrated next.

5. Reducing Inductor Count

Figure 5:
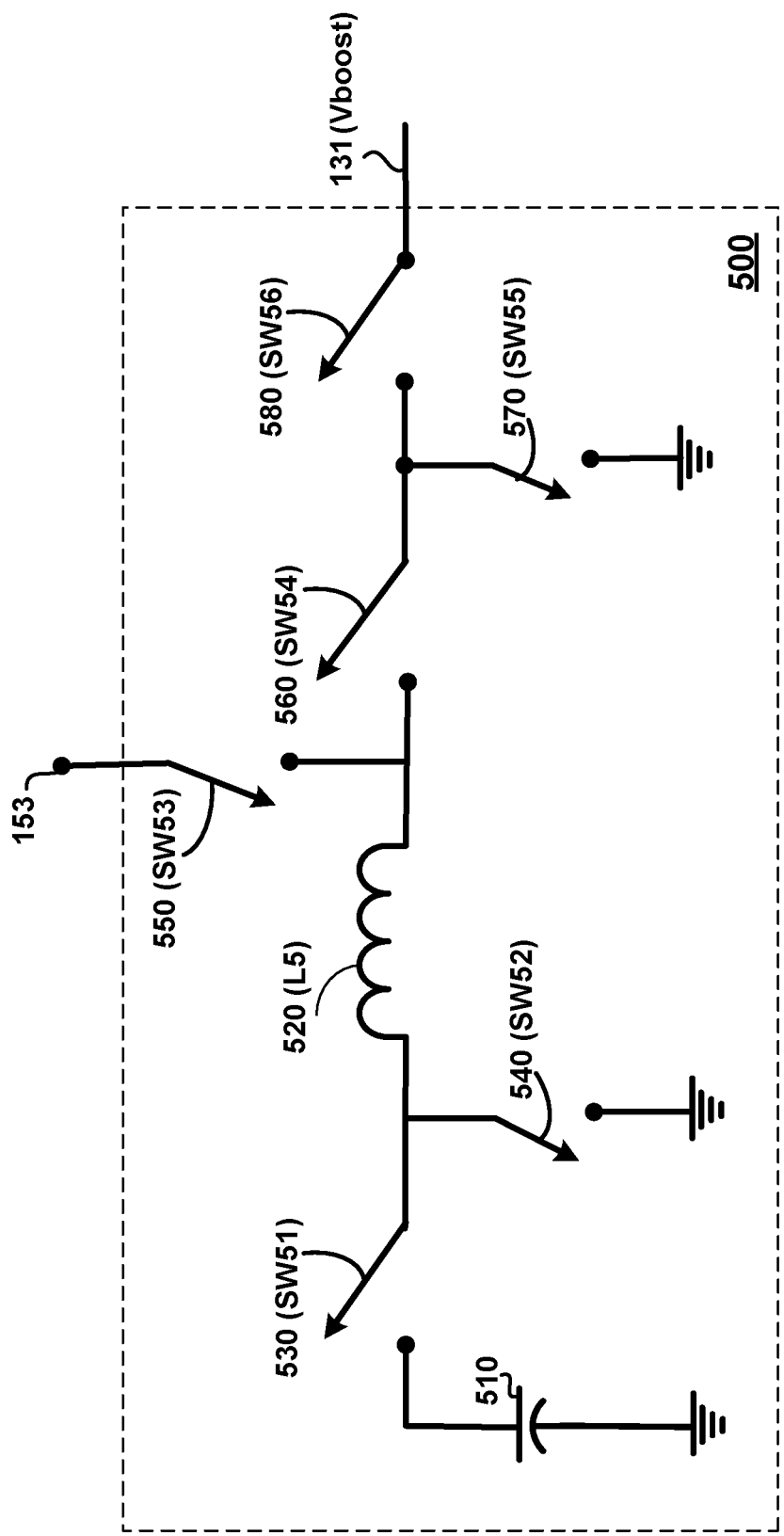
FIG. 5 is a diagram illustrating the details of a circuit that minimizes the number of inductors used in a power supply, in an embodiment of the present disclosure.

In an alternative embodiment of the present disclosure, the combination of boost converters 382 and 383 of power supply 300 is implemented using a single inductor. FIG. 5 is a diagram illustrating the details of circuit 500 which is implemented in place of boost converters 382 and 383 in an embodiment of the present disclosure. Circuit 500 is shown containing capacitor 510, inductor 520 (L5), and switches 530 (SW51), 540 (SW52), 550 (SW53), 560 (SW54), 570 (SW55) and 580 (SW56). Battery terminal 153 and output voltage terminal 131 are also shown in the Figure. Capacitor 510 corresponds to capacitor 308 of FIG. 3. Each of switches SW51, SW52, SW53, SW54, SW55 and SW56 may be implemented, for example, as transistors such as MOS transistors, BJT etc. The state (open or closed) of each of switches SW51, SW52, SW53, SW54, SW55 and SW56 are controlled by signals (not shown) generated by logic and timer block 450.

When circuit 500 is to regulate the voltage at node 131 (i.e., operate as, or similar to, boost converter 382), logic and timer block 450 maintains switches SW52 and SW53 in the open state, switches SW51 and SW54 in the closed state, and controls the states of each of switches SW55 and SW56 to be open or closed as described above with respect to switches SW3 and SW4 respectively and boost converter 382 (FIG. 3).

When circuit 500 is to charge capacitor 510 (i.e., operate as, or similar to, boost converter 383), logic and timer block 450 maintains switches SW54, SW55 and SW56 in the open state, switch SW53 in the closed state, and controls the states of each of switches SW52 and SW51 to be open or closed as described above with respect to switches SW5 and SW6 respectively and boost converter 383 (FIG. 3).

Power supply 300 implemented as described above, can be used in a larger device or system as described next with examples.

6. Device/System

Figure 6:
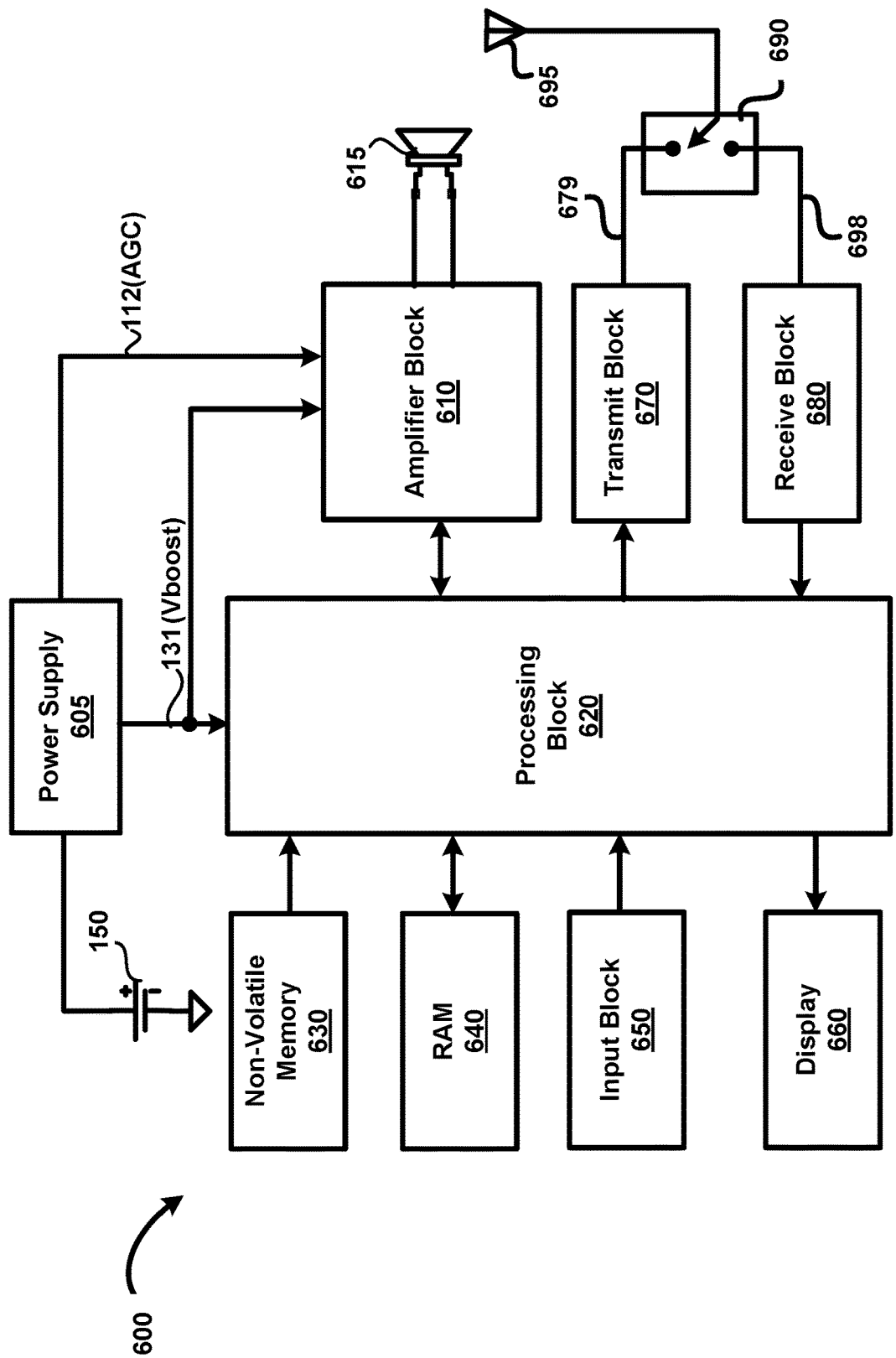
FIG. 6 is a block diagram of a device/system incorporating a power amplifier implemented according to several aspects of the present disclosure.

FIG. 6 is a block diagram illustrating the implementation details of a device/system in an embodiment of the present disclosure. Mobile phone 600 is shown containing battery 150, power supply 605, amplifier block 610, speaker 615, processing block 620, non-volatile memory 630, random access memory (RAM) 640, input block 650, display 660, transmit block 670, receive block 680, switch 690 and antenna 695. The specific components/blocks of mobile phone 600 are shown merely by way of illustration. However, mobile phone 600 may contain more or fewer components/blocks.

Battery 150 is the same as that shown and described in sections above. Power supply 605 corresponds to power supply 300 of FIGS. 3, 4 and 5, and generates a regulated power supply output voltage 131, which powers each of blocks 610, 620, 630, 640, 650, 660, 670 and 680. However, in FIG. 6, only the power connection to processing block 620 and amplifier block 610 are shown for clarity.

Load current (Iload) drawn from power supply 605 is the sum of all currents drawn by the blocks (or loads in general) 610, 620, 630, 640, 650, 660, 670 and 680, and may have a pattern similar to that illustrated in FIG. 2, with the current spikes in intervals T1 and T2 shown there being caused by the peak current demands of amplifier block 610 and speaker 615 alone, or in general the combination of one or more of blocks/loads shown in mobile phone 600 (other than power supply 605).

Amplifier block 610 corresponds to amplifier block 110 of FIG. 1, and drives speaker 615 to play audio/speech signals received from processing block 620. Signal 112 (AGC) is the same as signal 112 (AGC) of FIG. 1.

Processing block 620 may store speech and/or audio signals that are represented by the signal provided as input to amplifier block 610, in the form of files in non-volatile memory 630. Such files may be input to mobile phone 600 via input block 650 or received via receive block 680 and antenna 695. Processing block 620 is deemed to internally contain the equivalents of blocks 160 and 170 of FIG. 1, and also receives the equivalent of signal 116 of FIG. 1 from amplifier block 610. Further, processing block 620 may internally contain analog-to-digital converters (ADC) as well as digital-to-analog-converters (DAC). The ADC may be used to convert audio/speech signals received via input block 650 or receive block 680 and antenna 695 to digital form. The DAC may be used to convert digital signals representing audio/speech signals to analog form. Processing block 620 may process audio/speech signals, convert such signals to analog form using the DAC and provide the analog audio/speech signals to amplifier block 610.

Input block 650 represents one or more input devices used to provide user inputs to mobile phone 600. Input block 650 may include a keypad, microphone, etc. Display 660 represents a display screen (e.g., liquid crystal display) to display images/text generated by processing block 620.

Antenna 695 operates to receive from, and transmit to, a wireless medium, information-bearing wireless signals carrying speech and/or audio (among other types of information). Switch 690 may be controlled by processing block 620 (connection not shown) to connect antenna 695 either to receive block 680 via path 698, or to transmit block 670 via path 679, depending on whether mobile phone 600 is to receive or transmit wireless signals.

Transmit block 670 receives data/speech/audio (information signal in general) to be transmitted from processing block 620, generates a radio frequency (RF) signal modulated by the information signal according to corresponding standards such as GSM, CDMA, etc., and transmits the RF signal via switch 690 and antenna 695. Receive block 680 receives an RF signal bearing an information signal via switch 690, path 698 and antenna 695, demodulates the RF signal, and provides the extracted information (speech/audio/data) to processing block 620.

Non-volatile memory 630 is a non-transitory machine readable medium, and stores instructions, which when executed by processing block 620, causes mobile phone 600 to provide several features. RAM 630 is a volatile random access memory, and may be used for storing instructions and data.

Processing block 620 (or processor in general) may contain multiple processing units (processors) internally, with each processing unit potentially being designed for a specific task. Alternatively, processing block 620 may contain only a single general-purpose processing unit. Processing block 620 may execute instructions stored in non-volatile memory 630 or RAM 640 to enable mobile phone 600 to operate to provide various features.

7. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1 through 6, although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A power supply comprising:
   a first DC-DC converter to generate regulated power supply voltage on an output node of said power supply based on power received from a first power source, wherein said first power source has a maximum output current limit;
   a second DC-DC converter operable to generate regulated power supply voltage on said output node based on power received from a second power source; and
   a control block designed to cause generation of a regulated power supply voltage of a desired magnitude based on both of said first DC-DC converter and said second DC-DC converter, said control block being designed to operate only said first DC-DC converter to provide said regulated power supply voltage on said output node when a first peak current demand of one or more loads coupled to said output node is less than said maximum output current limit of said first power source, said control block designed to operate both of said first DC-DC converter and said second DC-DC converter to together provide said regulated power supply voltage on said output node when a second peak current demand of said one more loads exceeds said maximum output current limit.

2. The power supply of claim 1, wherein said second power source is designed to charge from said first power source.

3. The power supply of claim 2, wherein, when said second peak current demand of said one or more loads exceeds said maximum output current limit, said control block is designed to:
   operate said first DC-DC converter to provide to said one or more loads a first current having a first magnitude; and
   operate said second DC-DC converter to provide to said one or more loads a second current having a second magnitude, said second magnitude being equal to the difference between said second peak current demand and said first magnitude.

4. The power supply of claim 3, wherein said control block is designed to operate said first DC-DC converter as a current source to provide said first current.

5. The power supply of claim 4, wherein said control block is designed to operate said second DC-DC converter as a voltage source to provide said second current as well as to regulate said regulated power supply voltage when said second peak current demand of said load exceeds said maximum output current limit.

6. The power supply of claim 5, further comprising a third DC-DC converter, wherein said control block is designed to operate said third DC-DC converter to charge said second power source when said first peak current demand is less than said maximum output current limit.

7. The power supply of claim 6, wherein said first power source is one of a battery and a fuel cell, and said second power source is a capacitor,
   wherein said first magnitude of said first current is equal to said maximum output current limit.

8. The power supply of claim 7, wherein said one or more loads comprises an amplifier block that drives a speaker, wherein said amplifier block is coupled to receive a first signal and to amplify said first signal to provide a power-amplified signal to said speaker.

9. The power supply of claim 8, wherein said first signal is delayed by a delay block before being provided to said amplifier block,
   wherein said control block is coupled to receive, as a reference signal, one of said first signal, said power-amplified signal and a sum of said first signal and said power-amplified signal,
   wherein said control block is designed to determine whether said second peak current demand exceeds said maximum output current limit based on said reference signal.

10. The power supply of claim 9, wherein said control block is designed to limit the sum of currents supplied by said battery to said first DC-DC converter and said third DC-DC converter to said maximum output current limit.

11. The power supply of claim 9, wherein said control block is designed to disable operation of said second DC-DC converter to prevent discharge of said capacitor below a threshold voltage even when said second peak current demand exceeds said maximum output current limit.

12. The power supply of claim 9, wherein the combination of said second DC-DC converter and said third DC-DC converter is implemented to contain only a single inductor.

13. The power supply of claim 9, wherein said logic block operates said first DC-DC converter and said second DC-DC converter to maintain the instantaneous magnitude of said regulated power supply voltage to be always greater than the instantaneous magnitude of said power-amplified signal by a fixed amount, thereby enabling operation of said amplifier block as a class-L power amplifier.

14. A mobile phone comprising:
   a first power source, a speaker, a processor, a power amplifier and a power supply, said power supply to provide a regulated power supply voltage to each of said processor and said power amplifier,
   wherein said power amplifier is coupled to receive an input signal from said processor and is designed to generate a power-amplified signal, wherein said power-amplified signal is coupled to drive said speaker,
   wherein said power supply comprises:
      a first DC-DC converter coupled to receive power from said first power source, said first DC-DC converter operable to generate, from said first power source, a regulated power supply voltage on an output node of said power supply, wherein said first power source has a maximum output current limit;
      a second DC-DC converter comprising a second power source, said second DC-DC converter operable to generate, from said second power source, said regulated power supply voltage on said output node; and
      a control block designed to operate only said first DC-DC converter to provide said regulated power supply voltage on said output node when a first peak current demand of one or more loads coupled to said output node is less than said maximum output current limit, said control block designed to operate both of said first DC-DC converter and said second DC-DC converter to together provide said regulated power supply voltage on said output node when a second peak current demand of said one or more loads exceeds said maximum output current limit.

15. The mobile phone of claim 14, wherein said first power source comprises a battery, said second power source comprises a capacitor, and said one or more loads comprise said power amplifier.

16. The mobile phone of claim 15, wherein, when said second peak current demand exceeds said maximum output current limit, said control block is designed to:
- operate said first DC-DC converter to provide to said power amplifier a first current having a first magnitude; and
- operate said second DC-DC converter provide to said power amplifier a second current having a second magnitude, said second magnitude being equal to the difference between said second peak current demand and said first magnitude.

17. The mobile phone of claim 16, wherein said first magnitude equals said maximum output current limit,
- wherein said control block is designed to operate said first DC-DC converter as a current source to provide said first current,
- wherein said control block is designed to operate said second DC-DC converter as a voltage source to provide said second current as well as to regulate said regulated power supply voltage when said second peak current demand of said load exceeds said maximum output current limit.

18. The mobile phone of claim 17, wherein said power supply further comprises a third DC-DC converter, wherein said control block is designed to operate said third DC-DC converter to charge said capacitor when said first peak current demand is less than said maximum output current limit.

19. The mobile phone of claim 18, wherein said input signal is delayed by said processor before being provided to said power amplifier,
- wherein said control block is coupled to receive, as a reference signal, one of said input signal, said power-amplified signal and a sum of said first signal and said power-amplified signal,
- wherein said control block is designed to:
  - determine whether said second peak current demand exceeds said maximum output current limit based on said reference signal;
  - limit the sum of currents supplied by said battery to said first DC-DC converter and said third DC-DC converter to said maximum output current limit; and
  - disable operation of said second DC-DC converter to prevent discharge of said capacitor below a threshold voltage even when said second peak current demand exceeds said maximum output current limit.

\* \* \* \* \*